United States Patent [19]

Ohba et al.

[11] Patent Number: 4,654,555

[45] Date of Patent: Mar. 31, 1987

[54] MULTI POLE PIEZOELECTRICALLY OPERATING RELAY

[75] Inventors: Masatoshi Ohba, Nagaokakyo; Ryuichi Sato; Tsutomu Taniguchi, both of Kyoto, all of Japan

[73] Assignee: Omron Tateisi Electronics Co., Kyoto, Japan

[21] Appl. No.: 646,546

[22] Filed: Sep. 4, 1984

[30] Foreign Application Priority Data

Sep. 5, 1983 [JP] Japan ................................ 58-138084

[51] Int. Cl.$^4$ ................................ H01L 41/08

[52] U.S. Cl. ................................ 310/332; 200/181

[58] Field of Search ............... 310/317, 330, 331, 332, 310/328; 200/181

[56] References Cited

U.S. PATENT DOCUMENTS

| | | | |
|---|---|---|---|
| 2,166,763 | 7/1939 | Mason | 310/332 |
| 2,835,761 | 5/1958 | Crownover | 310/332 |
| 3,110,824 | 11/1963 | Flanagan | 310/332 X |
| 4,093,883 | 6/1978 | Yammamoto | 310/332 X |
| 4,112,279 | 9/1978 | Brohard | 310/332 X |
| 4,450,375 | 5/1984 | Siegal | 310/332 X |
| 4,473,859 | 9/1984 | Stone et al. | 310/330 X |

FOREIGN PATENT DOCUMENTS

| | | | |
|---|---|---|---|
| 273157 | 7/1964 | Australia | 310/331 |
| 060005 | 5/1977 | Japan | 310/331 |

*Primary Examiner*—Mark O. Budd
*Attorney, Agent, or Firm*—Wegner & Bretschneider

[57] ABSTRACT

This multi pole relay includes: a base plate; several bimorphic elements each of elongate plate shape and including a central electrode of elongate plate shape, a pair of piezoelectric members of elongate thin plate shape arranged on opposite sides of the central electrode, and a pair of surface electrodes arranged on the outer surfaces of the pair of piezoelectric members; a means for fixedly mounting the one ends of the bimorphic elements to the base plate with their other ends free; and, for each one of the bimorphic elements: a fixed contact mounted to the base plate opposing the free end of that one of the bimorphic elements; a flexible element, one end of which is mounted to the base plate, and the other free end of which is interposed between the free end of that one of the bimorphic elements and the fixed contact; and a movable contact mounted on the free end of the flexible element on its side towards the fixed contact and opposing the fixed contact. Thereby, the relay may be made very compact and of very low profile, and accordingly is suitable for fitting to a printed circuit board in conjunction with integrated circuits.

9 Claims, 3 Drawing Figures

MULTI POLE PIEZOELECTRICALLY OPERATING RELAY

BACKGROUND OF THE INVENTION

The present invention relates to a multi pole relay, and in particular to such a multi pole relay which operates by the action of a bimorphic element including piezoelectric material.

Most relays which are used for switching electric current for control purposes are based upon the principle in which a movable armature is selectively attracted by a coil which is wound upon a core, said movable armature opening and/or closing an electric circuit by this motion. However, because relays of this type include a coil which typically has an iron core, there is a limit to the extent to which they may be made compact and low profile. In particular, when it is required to provide a compound or multi pole relay, such as one which provides independent switching of a plurality of contacts, which is of low profile configuration and is compact, such as is suitable for fitting to a printed circuit board in conjunction with integrated circuits, it is very difficult to meet this demand with such a conventional type of armature and coil relay.

SUMMARY OF THE INVENTION

Accordingly, it is the primary object of the present invention to provide a multi pole relay which can be made compact.

It is a further object of the present invention to provide such a multi pole relay which can be made of very low profile.

It is a further object of the present invention to provide such a multi pole relay which is suitable for fitting to a printed circuit board in conjunction with integrated circuits.

It is a further object of the present invention to provide such a multi pole relay which provided independent switching of a plurality of contacts.

It is a further object of the present invention to provide such a multi pole relay which has uniform operational characteristics.

It is a yet further object of the present invention to provide such a multi pole relay which may be fabricated easily.

It is a yet further object of the present invention to provide such a multi pole relay which is economical to manufacture.

According to the most general aspect of the present invention, these and other objects are accomplished by a multi pole relay comprising: (a) a base plate; (b) a plurality of bimorphic elements each of elongate plate shape and comprising: (b1) a central electrode of elongate plate shape; (b2) a pair of piezoelectric members of elongate thin plate shape arranged on opposite sides of said central electrode; and (b3) a pair of surface electrodes arranged on the outer surfaces of said pair of piezoelectric members; (c) a means for fixedly mounting the one ends of said bimorphic elements to said base plate with their other ends free; (d) and, for each one of said bimorphic elements: (d1) a fixed contact mounted to the base plate opposing the free end of said one of said bimorphic elements; (d2) a flexible element, one end of which is mounted to said base plate, and the other free end of which is interposed between said free end of said one of said bimorphic elements and said fixed contact; and (d3) a movable contact mounted on said free end of said flexible element on its side towards said fixed contact and opposing said fixed contact.

According to such a structure, the multi pole relay can be made compact, since it utilizes for its switching operation, not solenoid and coil arrangements as described above, but the switching action of these bimorphic elements, as will be described later in this specification. Specifically, for each one of said bimorphic elements, it may be caused to curve by electrical voltage being applied between said central electrode and at least one of said surface electrodes, and in this case said free end of said one of said bimorphic elements is caused to pinch said free end of the corresponding flexible element between itself and the corresponding fixed contact, pressing the corresponding movable contact against said fixed contact. By this construction, the multi pole relay of the present invention can be made of very low profile, as thin in fact as 5 mm or less, and accordingly this relay is particularly suitable for being fitted to a printed circuit board as a modular unit in conjunction with integrated circuits. And, since a plurality of bimorphic elements are provided, by applying electrical voltage between the central electrode and at least one of the surface electrodes of the various ones of said bimorphic elements, independent switching of various pairs of the plurality of pairs of said movable and fixed contacts is available.

Further, according to a more particular aspect of the present invention, these and other objects are more particularly and concretely accomplished by such a multi pole relay as detailed above, wherein said bimorphic elements are arranged in a mutually parallel orientation.

According to such a structure, the multi pole relay may be made yet more compact and with a yet lower profile.

Further, according to a yet more particular aspect of the present invention, these and other objects are yet more particularly and concretely accomplished by such a multi pole relay as detailed above, wherein on each side of the set of bimorphic elements all the piezoelectric members of elongate thin plate shape of said bimorphic elements are formed as extensions of one piezoelectric plate element, and/or the central plate electrodes are formed as extensions of one central electrode plate element.

According to such a structure, the multi pole relay can be ensured to have more uniform operational characteristics, because all the piezoelectric members are formed from the same plate element and accordingly have more uniform properties. Further, supporting the piezoelectric members and/or the central plate electrodes on the base plate of the relay becomes easier, and accordingly such a multi pole relay may be fabricated easily. Further, this construction makes it easy to assemble and accordingly economical to manufacture.

BRIEF DESCRIPTION OF THE DRAWINGS

The present invention will now be shown and described with reference to the preferred embodiment thereof, and with reference to the illustrative drawings. It should be clearly understood, however, that the description of the embodiment, and the drawings, are all of them given purely for the purposes of explanation and exemplification only, and are none of them intended to be limitative of the scope of the present invention in any way, since the scope of the present invention is to be defined solely by the legitimate and proper scope of the appended claims. In the drawings, like parts are denoted by like symbols in the various figures thereof, and:

DESCRIPTION OF THE PREFERRED EMBODIMENT

Figure 1:
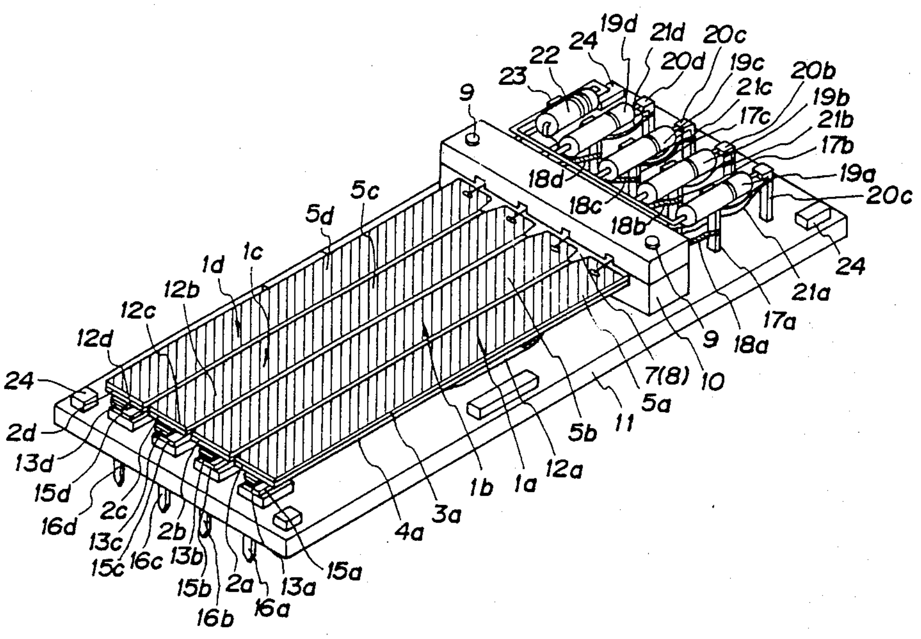
FIG. 1 is a perspective view of the preferred embodiment of the multi pole bimorphically actuated relay according to the present invention, with its outer cover removed so as to show its internal construction.
Figure 2:
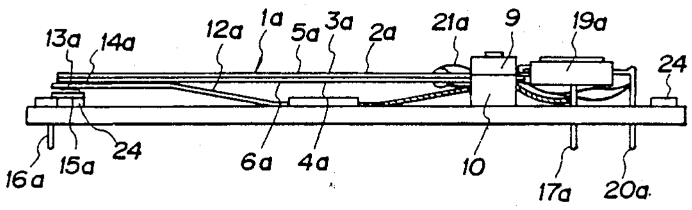
FIG. 2 is a side view of said internal construction of said preferred embodiment.

The present invention will now be described with reference to the preferred embodiment thereof, and with reference to the appended drawings. FIG. 1 is a perspective view of said preferred embodiment with its outer cover removed. In the figures, the reference symbols 1*a*, 1*b*, 1*c*, and 1*d* denote four bimorphic elements (this term will be explained later), each of which is formed in a long bar shape, which extend parallel to one another. The bimorphic element 1*a* is made of a pair of thin upper and lower piezoelectric plates 3*a* and 4*a* which sandwich between them a middle electrode plate 2*a*, and on the outward facing surface of the upper piezoelectric plate 3*a* on the upper side of the bimorphic element 1*a* in the figures there is fitted an upper surface electrode plate 5*a*, while on the outward facing surface of the lower piezoelectric plate 4*a* on the lower side of the bimorphic element 1*a* in the figures there is fitted a lower surface electrode plate 6*a*. The other bimorphic elements 1*b*, 1*c*, and 1*d* are similarly constructed to the bimorphic element 1*a*; their parts which correspond to the above described parts 2*a*, 3*a*, 4*a*, 5*a*, and 6*a* of the bimorphic element 1*a* are denoted by the same reference numbers with the appropriate letter affixed thereto. In fact, the upper piezoelectric plates 3*a*, 3*b*, 3*c*, and 3*d* are in the shown preferred embodiment formed as one member, being extensions from the base 7 of a comb shaped upper piezoelectric plate 3, said base being to the right side of the relay in FIG. 2, which is a side view of said internal construction of said preferred embodiment. Similarly, the lower piezoelectric plates 4*a*, 4*b*, 4*c*, and 4*d* are in the shown preferred embodiment formed as one member, being extensions from the base 8 of a comb shaped lower piezoelectric plate 4, and the middle electrode plates 2*a*, 2*b*, 2*c*, and 2*d* also are in the shown preferred embodiment formed as one member, being extensions from the base of a comb shaped middle electrode plate 2; and thus said middle electrode plates 2*a*, 2*b*, 2*c*, and 2*d* are electrically connected together. However, the upper surface electrode plates 5*a*, 5*b*, 5*c*, and 5*d* are individually formed and are electrically insulated from one another, and so are the lower surface electrode plates 6*a*, 6*b*, 6*c*, and 6*d*.

The bases 7 and 8 of the comb shaped upper and lower piezoelectric plates 3 and 4 and the base of the comb shaped middle electrode plate 2 are mounted by being clamped between a mounting member 10 and a top member 9, said mounting member 10 being fixed to a base plate 11 of the relay. Pieces 24 are fixed to this base plate 11 for locating and securing a casing cover, not shown, for the relay.

A flexible metallic member 12*a* is mounted beneath the bimorphic element 1*a* and extends along and opposed thereto, with its one end (the right end in the figures) being fixed to the base plate 11 and with its body being bent upwards so that the upper side of its other end (its left end in the figures) is by the inherent elasticity of said metallic member 12*a* lightly kept in contact, via an insulating pad 14*a*, with the corresponding left end in the figures of the bimorphic element 1*a*. The lower side of said left end in the figures of said metallic member 12*a* is furnished with a movable contact 13*a*, which opposes a fixed contact 15*a* which is fixedly secured to the base plate 11. Similarly, for the other bimorphic elements 1*b*, 1*c*, and 1*d*, similar flexible metallic members 12*b*, 12*c*, and 12*d* are provided with similar movable contacts 13*b*, 13*c*, and 13*d* on their ends, and similar fixed contacts 15*b*, 15*c*, and 15*d* are provided fixed to the base plate 11 and opposing these movable contacts 13*b*, 13*c*, and 13*d*. Thus, in the condition of the elements shown in the figures, wherein each of the bimorphic elements 1*a*, 1*b*, 1*c*, and 1*d* is in the straight condition, by the inherent elasticity of the metallic members 12*a*, 12*b*, 12*c*, and 12*d* the movable contacts 13*a*, 13*b*, 13*c*, and 13*d* are kept somewhat displaced from the fixed contacts 15*a*, 15*b*, 15*c*, and 15*d*.

The fixed contacts 15*a*, 15*b*, 15*c*, and 15*d* are respectively electrically connected to terminals 16*a*, 16*b*, 16*c*, and 16*d* which extend to the outside of the relay on the lower surface of its base plate 11. And the respectively corresponding movable contacts 13*a*, 13*b*, 13*c*, and 13*d* are respectively electrically connected to terminals 17*a*, 17*b*, 17*c*, and 17*d* which extend to the outside of the relay on the lower surface of its base plate 11, via the metallic members 12*a*, 12*b*, 12*c*, and 12*d* and via lead wires 18*a*, 18*b*, 18*c*, and 18*d* connected between the fixed base end pieces of said metallic members 12*a*, 12*b*, 12*c*, and 12*d* and said terminals 17*a*, 17*b*, 17*c*, and 17*d*. And respective power supply terminals 20*a*, 20*b*, 20*c*, and 20*d* for the bimorphic elements 1*a*, 1*b*, 1*c*, and 1*d*, for supply of a certain polarity side of the actuating electrical energy for them, are also fitted so as to extend to the outside of the relay on the lower surface of its base plate 11, while a common power supply terminal 23 for all of the bimorphic elements 1*a*, 1*b*, 1*c*, and 1*d*, for supply of the opposite polarity side of the actuating electrical energy for them, is similarly fitted so as to extend to the outside of the relay on the lower surface of its base plate 11.

Figure 3:
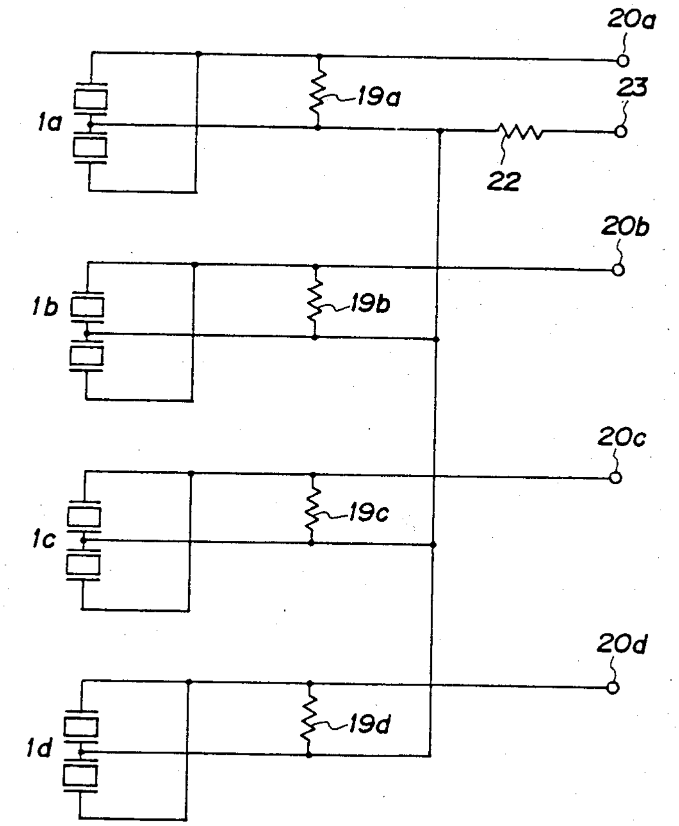
FIG. 3 is a circuit diagram showing an electric power supply circuit for the bimorphic elements of said multi pole bimorphically actuated relay according to the present invention.

In FIG. 3, there is shown the circuit diagram for the connections between these power supply terminals 20*a*, 20*b*, 20*c*, 20*d*, and 23 and the electrode plates of the bimorphic elements 1*a*, 1*b*, 1*c*, and 1*d*. As explained earlier, the middle electrode plates 2*a*, 2*b*, 2*c*, and 2*d* are electrically connected together, and they are commonly connected, via a surge current limiting resistor 22, to the common power supply terminal 23 for supply of the opposite polarity side of the actuating electrical energy for all of the bimorphic elements 1*a*, 1*b*, 1*c*, and 1*d*. This surge current limiting resistor 22 is for controlling any sudden surge of said actuating electrical energy for the bimorphic elements 1*a*, 1*b*, 1*c*, and 1*d*. The upper surface electrode plate 5*a* of the bimorphic element 1*a* and the lower surface electrode plate thereof are connected to the power supply terminal 20*a* for supply of said certain polarity side of the actuating electrical energy for said bimorphic element 1*a* via lead wires 21*a*, 21*a*, said power supply terminal 20*a* also being connected to the common connection of the middle electrode plates 2*a*, 2*b*, 2*c*, and 2*d* via a discharge resistor 19*a*; and, likewise, the upper surface electrode plate 5*b* of the bimorphic element 1*b* and the lower surface electrode plate thereof are connected to the power supply terminal 20*b* for supply of said certain polarity side of the actuating electrical energy for said bimorphic element 1*b* via lead wires 21*b*, 21*b*, said power supply terminal 20*b* also being connected to the common connection of the middle electrode plates 2*a*, 2*b*, 2*c*, and 2*d* via a discharge resistor 19*b*; the uppper surface electrode plate 5*c* of the bimorphic element 1*c* and the lower surface electrode plate thereof are connected to the power supply terminal 20*c* for supply of said certain polarity side of the actuating electrical energy for said bimorphic element 1*c* via lead wires 21*c*, 21*c*, said power supply terminal 20*c* also being connected to the common connection of the middle electrode plates 2*a*, 2*b*, 2*c*, and 2*d* via a discharge resistor 19*c*; and the upper surface electrode plate 5*d* of the bimorphic element 1*d* and the lower surface electrode plate thereof are connected to the power supply terminal 20*d* for supply of said certain polarity side of the actuating electrical energy for said bimorphic element 1*d* via lead wires 21*d*, 21*d*, said power supply terminal 20*d* also being connected to the common connection of the middle electrode plates 2*a*, 2*b*, 2*c*, and 2*d* via a discharge resistor 19*d*.

Now, the action and operation of this multi pole relay will be described.

When no electric voltage is applied between the power supply terminal 20*a* and the common power supply terminal 23, then the bimorphic element 1*a* remains as shown in the figure in the straight condition, and in this state, as mentioned above, by the inherent elasticity of the metallic member 12*a*, the movable contact 13*a* is kept somewhat displaced from the fixed contact 15*a*; and, accordingly, the terminal 16*a* of the relay is electrically disconnected from its terminal 17*a*.

On the other hand, when a direct current electric voltage of the polarity specified is applied between the power supply terminal 20*a* and the common power supply terminal 23, said electric voltage being supplied via the surge current limiting resistor 22 and the lead wire 21*a* so as to generate an electric field between the middle electrode plate 2*a* of the bimorphic element 1*a* and the upper surface electrode plate 5*a* thereof, as well as an electric field of opposite orientation between said middle electrode plate 2*a* of said bimorphic element 1*a* and the lower surface electrode plate 6*a* thereof, then said bimorphic element 1*a* acts as follows. Since this bimorphic element 1*a* is so structured that the piezoelectric polarities of the upper and lower piezoelectric plates 3*a* and 4*a* thereof are the same, and since the electric fields which are being applied to these upper and lower piezoelectric plates 3*a* and 4*a* are currently opposite in polarity, one of these upper and lower piezoelectric plates 3*a* and 4*a* is thereby caused to contract in its dimension along the applied electric field (perpendicular to the surfaces of said plate) and to expand in the directions perpendicular to said applied electric field (parallel to the surfaces of said plate), while the other of these upper and lower piezoelectric plates 3*a* and 4*a* is simultaneously caused to expand in its dimension along the applied electric field and to contract in the directions perpendicular to said applied electric field. Thereby, in a manner analogous to the action of a bimetallic strip when it is heated, the bimorphic element 1*a* as a whole is caused to curve along its longitudinal direction. This is the reason for terming the element 1*a* a "bimorphic element". The aforementioned polarity of the voltage supply to the relay for switching it is so selected that, when it is applied across the terminals 20*a* and 23, the bimorphic element 1*a* curves so that its free end is moved downwards in FIGS. 1 and 2 and pushes, via the insulating pad 14*a*, the free end of the flexible metallic member 12*a* downward in the figures against its inherent elasticity which is relatively of low strength, so that the movable contact 13*a* thereon comes into contact with the opposing fixed contact 15*a*. Thereby, the terminal 16*a* of the relay becomes electrically connected to its terminal 17*a*.

And, when the supply of actuating electrical voltage described above between the terminal 20*a* and the terminal 23 of the relay is stopped, the electric charge between the middle electrode plate 2*a* of the bimorphic element 1*a* and the upper surface electrode plate 5*a* and the lower surface electrode plate 6*a* thereof is fairly quickly discharged through the discharge resistor 19*a*, and accordingly fairly quickly the electric fields which are being applied to the upper and lower piezoelectric plates 3*a* and 4*a* become zero. Accordingly, the bimorphic element 1*a* is caused to straighten out again, so that its free end is moved upwards in FIGS. 1 and 2 and allows the free end of the flexible metallic member 12*a* to move upwards in the figures by the action of its inherent elasticity, so that the movable contact 13*a* thereon is brought out of contact with the opposing fixed contact 15*a*. Thereby, the terminal 16*a* of the relay becomes electrically disconnected from its terminal 17*a*.

Thereby, as a summary of this action, when electrical voltage of the appropriate polarity as specified above is being supplied between the terminal 20*a* and the terminal 23 of the relay, then its terminals 16*a* and 17*a* are electrically connected together, while, on the other hand, when no such electrical voltage is being supplied between the terminals 20*a* and 23, then the relay terminals 16*a* and 17*a* are electrically disconnected from one another. The same functioning as explained above with respect to the bimorphic element 1*a* is provided by the bimorphic elements 1*b*, 1*c*, and 1*d*, independently, and accordingly, independently of the above described action: when electrical voltage of the appropriate polarity as specified above is being supplied between the terminal 20*b* and the terminal 23 of the relay, then its terminals 16*b* and 17*b* are electrically connected together, while, on the other hand, when no such electrical voltage is being supplied between the terminals 20*b* and 23, then the relay terminals 16*b* and 17*b* are electrically disconnected from one another; and also, independently, when electrical voltage of the appropriate polarity as specified above is being supplied between the terminal 20*c* and the terminal 23 of the relay, then its terminals 16*c* and 17*c* are electrically connected together, while, on the other hand, when no such electrical voltage is being supplied between the terminals 20*c* and 23, then the relay terminals 16*c* and 17*c* are electrically disconnected from one another; and further, independently also, when electrical voltage of the appropriate polarity as specified above is being supplied between the terminal 20*d* and the terminal 23 of the relay, then its terminals 16*d* and 17*d* are electrically connected together, while, on the other hand, when no such electrical voltage is being supplied between the terminals 20*d* and 23, then the relay terminals 16*d* and 17*d* are electrically disconnected from one another. Thus, relay action is available from the relay of the shown construction, and four independent switching actions may be performed for the four pairs of terminals 16*a* and 17*a*, 16*b* and 17*b*, 16*c* and 17*c*, and 16*d* and 17*d*, by appropriate supply of actuating voltage between the respective terminal 20*a*, 20*b*, 20*c*, and 20*d*, and the common terminal 23. Accordingly multi pole relay function becomes available.

According to the described structure for the relay, the multi pole relay can be made compact, since it utilizes for its switching operation the switching action of the bimorphic elements, and the inherent thickness of such a construction is much less than is that of a prior art type of armature and coil construction. By this construction, the multi pole relay of the present invention can be made of very low profile, as thin in fact as 5 mm or less, and accordingly this relay is particularly suitable for being fitted to a printed circuit board as a modular unit in conjunction with integrated circuits. And, since a plurality of bimorphic elements 1*a*, 1*b*, 1*c*, and 1*d* are provided, by applying electrical voltage between the central electrode and various ones of the surface electrodes of said bimorphic elements, independent switching of various pairs of the plurality of pairs of the movable and fixed contacts is available. Also, because the bimorphic elements are arranged in a mutually parallel orientation, the multi pole relay may be made yet more compact and with a yet lower profile.

Further, because in the shown preferred embodiment of the present invention on each side of the set of bimorphic elements all the piezoelectric members of elongate thin plate shape are formed as extensions of one piezoelectric plate element, and also the central plate electrodes are formed as extensions of one central electrode plate element, therefore the multi pole relay can be ensured to have more uniform operational characteristics, because all the piezoelectric members are formed from the same plate element and accordingly have more uniform properties. Further, supporting the piezoelectric members and the central plate electrode on the base plate of the relay becomes easier, since their base portions can be simply clamped as between the members 9 and 10 of the shown preferred embodiment, and accordingly this multi pole relay may be fabricated easily. Further, this construction makes it easy to assemble and accordingly economical to manufacture. However, this construction is not essential to the present invention; it would be within the scope of the present invention to make the bimorphic elements individually and separately.

In the shown preferred embodiment, the discharge resistors 17*a*, 17*b*, 17*c*, and 17*d*, and the surge preventing resistor 22, were all arranged on the base plate 11, but this is not intended to be limiting, and alternatively they may be provided externally to the relay. Conversely, other members such as ICs could also be provided internally to the relay.

Although the present invention has been shown and described with reference to the preferred embodiment thereof, and in terms of the illustrative drawings, it should not be considered as limited thereby. Various possible modifications, omissions, and alterations could be conceived of by one skilled in the art to the form and the content of any particular embodiment, without departing from the scope of the present invention. Therefore it is desired that the scope of the present invention, and of the protection sought to be granted by Letters Patent, should be defined not by any of the perhaps purely fortuitous details of the shown preferred embodiment, or of the drawings, but solely by the scope of the appended claims, which follow.

What is claimed is:

1. A multi pole relay comprising:

(a) a base plate;

(b) a plurality of bimorphic elements each of elongate plate shape and formed as comb-like extensions integral with a base portion from which said bimorphic elements extend, comprising:

(b1) a central electrode plate element of elongate plate shape formed with a comb-like extension for each of said bimorphic elements;

(b2) a pair of piezoelectric plate elements formed with a comb-like extension for each of said bimorphic elements to make pairs of piezoelectric members of elongate thin plate shape arranged on oppsite sides of said comb-like extensions of said central electrode plate element; and (b3) a pair of surface electrodes arranged on the outer surfaces of each of said pairs of piezoelectric members;

(c) means for fixedly mounting one end of the base portion from which the bimorphic elements extend to said base plate leaving the other ends of the bimorphic elements free; and (d) corresponding to each of said bimorphic elements:

(d1) a fixed contact mounted to the base plate opposing the free end of said bimorphic element;

(d2) a flexible, resilient element, one end of which is mounted to said base plate between the fixed contact and the means for fixedly mounting the base portion of the bimorphic elements and the other, free end of which is interposed between said free end of said bimorphic element and said fixed contact; and (d3) a movable contact mounted on said free end of said flexible, resilient element on its side toward said fixed contact and opposing said fixed contact.

2. A multi pole relay according to claim 1, wherein said bimorphic elements are arranged in a mutually parallel orientation.

3. A multi pole relay according to claim 1, wherein, in each said bimorphic element, said pair of piezoelectric members are of the same piezoelectric polarity.

4. A multi pole relay according to claim 1, wherein an insulating pad is provided between each said free end of each said bimorphic element and the corresponding free end of the corresponding flexible element.

5. A multi pole relay according to claim 1, wherein for each said bimorphic element said pair of surface electrodes arranged on the outer surfaces of said pair of piezoelectric members are electrically connected together.

6. A multi pole relay according to claim 5, further comprising, for each said bimorphic element, a discharge resistor connecting between said electrically connected pair of surface electrodes and said central electrode.

7. A multi pole relay according to claim 1, wherein, for each one of said bimorphic elements, it may be caused to curve by electrical voltage being applied between said central electrode and at least one of said surface electrodes, and in this case said free end of said one of said bimorphic elements is caused to pinch said free end of the corresponding flexible element between itself and the corresponding fixed contact, pressing the corresponding movable contact against said fixed contact.

8. A multi pole relay according to claim 1, wherein the surface electrodes of each of said bimorphic elements are electrically isolated from the surface electrodes of all the other said bimorphic elements.

9. A multi pole relay comprising:

(a) a base plate;

(b) a plurality of bimorphic elements each of elongate plate shape and comprising:

(b1) a central electrode of elongate plate shape;

(b2) a pair of piezoelectric members of elongate thin plate shape arranged on opposite sides of said central electrode; and (b3) a pair of surface electrodes arranged on the outer surfaces of said pair of piezoelectric members;

(c) a means for fixedly mounting one end of the base portion from which the bimorphic elements extend to said base plate leaving the other ends of the bimorphic elements free; and (d) corresponding to each of said bimorphic elements:

(d1) a fixed contact mounted to the base plate opposing the free end of said bimorphic element;

(d2) a flexible, resilient element, one end of which is mounted to said base plate between the fixed contact and the means for fixedly mounting the base portion of the bimorphic elements and the other, free end of which is interposed between said free end of said bimorphic element and said fixed contact; and (d3) a movable contact mounted on said free end of said flexible, resilient element on its side toward said fixed contact and opposing said fixed contact.

* * * * *